United States Patent [19]
Barzegar

[11] Patent Number: 4,748,351
[45] Date of Patent: May 31, 1988

[54] POWER MOSFET GATE DRIVER CIRCUIT

[75] Inventor: Farhad Barzegar, Hillsborough Township, Somerset County, N.J.

[73] Assignee: American Telephone and Telegraph Company, AT&T Bell Laboratories, Murray Hill, N.J.

[21] Appl. No.: 900,578

[22] Filed: Aug. 26, 1986

[51] Int. Cl.⁴ .................. H03K 17/687; H03K 3/33
[52] U.S. Cl. ............................. 307/571; 307/572; 307/300; 307/270
[58] Field of Search ............... 307/571, 300, 280, 270, 307/570, 572

[56] References Cited

U.S. PATENT DOCUMENTS

| | | | |
|---|---|---|---|
| 3,805,054 | 4/1974 | Orlando | 307/300 |
| 4,438,356 | 3/1984 | Fleischer | 307/571 |
| 4,453,089 | 6/1984 | Shuey et al. | 307/253 |
| 4,461,966 | 7/1984 | Hebenstreit | 307/571 |
| 4,511,815 | 4/1985 | Wood | 307/584 |
| 4,575,642 | 3/1986 | Hochreutiner | 307/200 A |

Primary Examiner—Stanley D. Miller
Assistant Examiner—B. P. Davis
Attorney, Agent, or Firm—Alfred G. Steinmetz

[57] ABSTRACT

A MOSFET gate driver circuit reduces the noise susceptibility of a MOSFET switch by utilizing dual drive paths to apply turn-on and turn-off bias signals to the gate of the MOSFET. Drive pulses are coupled to the MOSFET switch via a pulse transformer which has two serially connected secondary windings. Turn-on pulses are coupled by a diode from the first secondary to the MOSFET gate. Turn-off pulses are coupled via the second secondary to a control MOSFET which is turned on by a turn-off pulse and remains on in order to keep the gate of the MOSFET switch to a hold off voltage.

3 Claims, 1 Drawing Sheet

POWER MOSFET GATE DRIVER CIRCUIT

This invention relates to control of MOSFET power switches and in particular to a driver circuit for controlling conductivity of the MOSFET power switch and preventing spurious switch transitions of the MOSFET power switch.

BACKGROUND OF THE INVENTION

Power MOSFET switches in their nonconducting condition are subject to a spurious turn-on if the drain source voltage changes with a high rate of change. Also, a MOSFET power switch presently conducting may spuriously turn off if its gate charge is permitted to drain or discharge during its conducting interval. Voltage variations producing such spurious transitions occur frequently in a noisy environment. These spurious transitions are subject to both external circuit conditions and to parasitic elements of the MOSFET power switch itself. While an unwanted transition of the MOSFET from on-state to off-state may be damaging to the performance of the overall power system, a spurious transition from off-state to on-state is frequently very severely damaging to the MOSFET power switch itself and in certain instances may cause its immediate destruction.

SUMMARY OF THE INVENTION

This problem is largely alleviated according to the invention by utilizing a gate drive circuit to control conductivity of a MOSFET power switch. The drive circuit isolates the gate from noise signals and provides an initial positive bias to turn on the MOSFET switch into a conducting state until a specific turn off bias signal is applied. In a particular embodiment, drive pulses are applied to a pulse transformer primary winding. A first secondary winding is coupled through a diode to the gate electrode of the MOSFET power and when the diode is forward biased it couples drive signals therethrough to drive the MOSFET power switch into conduction. A control MOSFET is connected to the gate of the MOSFET power switch to drain the charge from the gate in response to a pulse signal output of a second secondary winding coupled to a gate electrode of the control MOSFET, via a breakdown diode. The breakdown diode keeps the gate of the control MOSFET high and hence, prevents low level noise signals from spuriously biasing the power MOSFET into conduction.

BRIEF DESCRIPTION OF THE DRAWING

An understanding of the invention may be attained by reference to the following specification and the accompanying drawing in which.

DETAILED DESCRIPTION

Figure 1:
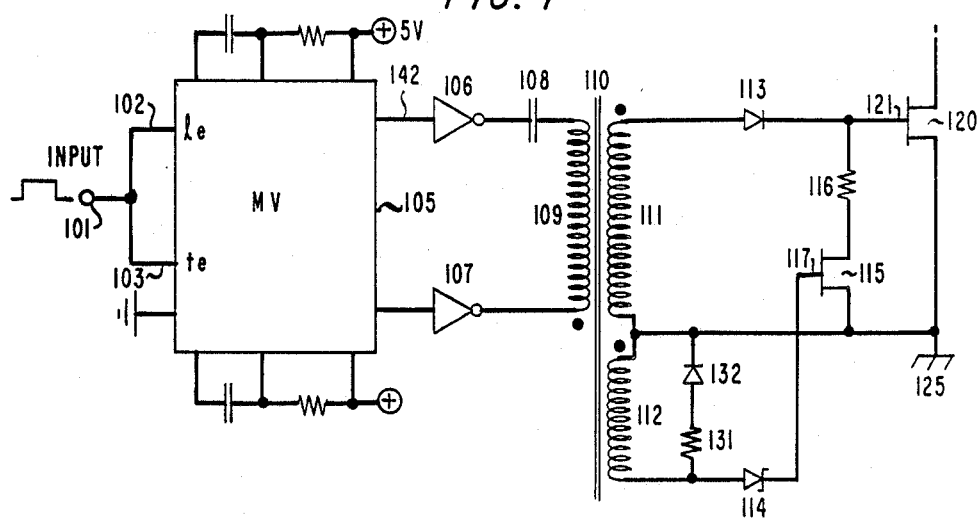
FIG. 1 is a schematic of a drive circuit embodying the principles of the invention, and FIG. 2 discloses waveforms helpful in understanding the operation of the circuit of FIG. 1.

A bias drive circuit for a MOSFET power switch is shown in FIG. 1. An input drive signal is applied to input terminal 101 and controls the conductivity state of the MOSFET power switch 120. The input terminal 101 is connected to two inputs 102 and 103 of a dual monostable circuit 105. The two inputs 102 and 103 are responsive to the leading and trailing edge, respectively of the input pulse applied to input terminal 101. The output in response to the leading and trailing edges of the input pulse are differentially coupled via the polarity inverting buffers 106 and 107 to opposite end terminals of the primary winding 109 of a drive transformer 110. This differential coupling of the primary winding 109 to buffers 106 and 107 permits the pulse output from buffers 106 and 107 to produce bipolar voltages across the primary winding 109.

The drive transformer 110 includes two secondary windings 111 and 112 connected in series and whose windings are oriented to the primary winding 109 as shown in FIG. 1. A diode 113 couples the top end terminal of secondary winding 111 to the gate electrode 121 of the MOSFET power switch 120. A control MOSFET 115 couples the gate electrode 121 to the source of power MOSFET 125. Drive for the control MOSFET 115 is provided by the secondary winding 112 whose lower end terminal is coupled to the gate electrode 117 via a voltage breakdown diode 114.

Figure 2:
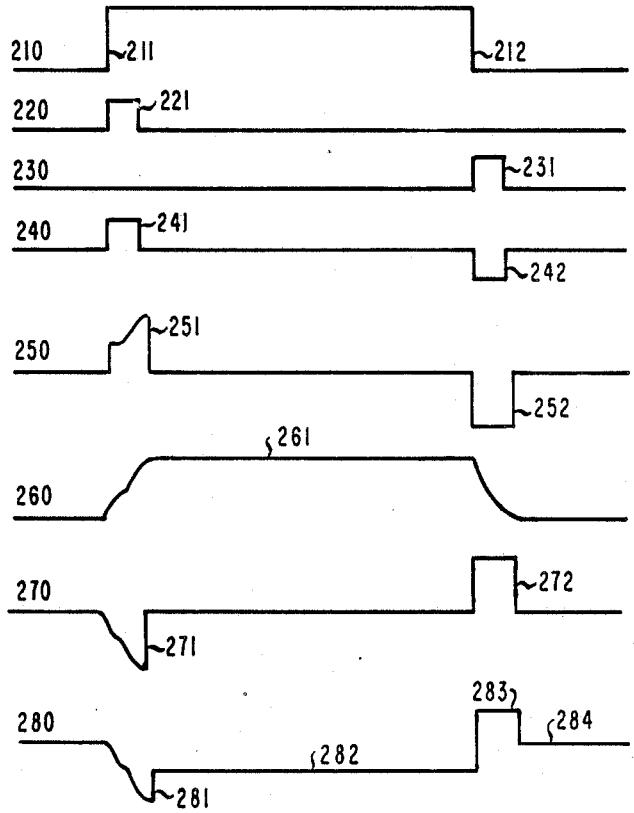

An understanding of the invention may be readily attained by describing the operation of the drive circuit disclosed in FIG. 1 with the assistance of the waveforms disclosed in FIG. 2. The turn on time of the MOSFET power switch 120 is controlled by the duration of an input drive pulse shown by waveform 210 which is applied to input terminal 101. The leading edge 211 triggers the monostable circuit 105 via input 102 and in response monostable circuit 105 generates a pulse output on lead 142 with a pulse duration shown by pulse 221 controlled by an RC timing circuit of the monostable circuit. This pulse is inverted by the polarity inverting buffer 106 and is applied to the top end terminal of the primary winding 109 appearing thereat as pulse 241 of waveform 240. (Positive polarity is at the dot of winding 109.) This pulse is coupled to and appears across both secondary windings 111 and 112 as pulse 251 of waveform 250. The deformation in waveform 250 is due to the leakage inductance of the drive transformer 110. Diode 113 is forward biased and couples the pulse 251 to the gate 121 of the MOSFET power switch 125. The pulse biases it into full conduction and the gate capacitance is charged up to a voltage level 261 as shown in waveform 260. Due to the blocking action of diode 113 which is back biased at the termination of pulse 251 the gate capacitance remains charged at the voltage level 261 until a turn-off signal is generated (assuming negligible gate leakage).

A negative pulse 271 as shown by waveform 270 is applied to the voltage breakdown diode 114. The voltage breakdown characteristic of the diode establishes a negative voltage 281 of voltage waveform 280 at the gate 117 of the control MOSFET 115. After the negative pulse, the gate 117 voltage stays at zero voltage shown by level 282 which keeps it in a turned off condition.

At the trailing edge 212 of the input pulse shown by waveform 210 the other monostable circuit pair of the dual monostable circuit 105 responds to the input at lead 103 to produce a pulse of controlled duration which appears at the output of the buffer 107 as pulse 231 shown by waveform 230 in FIG. 2. This pulse appears across primary winding 109 as pulse 242 of waveform 240 and across secondary windings 111 and 112 as pulse 252. Diode 113 is back biased and hence, blocks application of this pulse to the gate electrode 121 of MOSFET power switch 120. The voltage breakdown diode 114 however behaves as a diode and the pulse is applied to the gate lead 117 to turn on the control MOSFET device 115, thereby, completing a conductive path to drain the charge stored in the gate capacitance of the MOSFET power switch to source 125. The pulse 283 of waveform 280 biases the control MOSFET device 115 conducting and the waveform voltage level of waveform 280 does not return to ground but remains at the breakdown voltage level 284 to keep MOSFET 115 turned on and, thereby, prevent a spurious turn on of the MOSFET power switch 120.

A resistor 116 is connected in series with the control MOSFET device 115 and is operative for controlling the rate of discharge of the gate capacitance and to prevent a race condition when the power MOSFET is initially biased conducting. A resistor 131 and diode 132 are connected in series with each other and the series connection is shunted across the secondary winding 112 and is utilized as a load balancing circuit.

What is claimed is:

1. In combination:
   a MOSFET power switch including a gate electrode and a main conduction path coupled to first and second main conduction path electrodes,
   a drive circuit for controlling a conductive state of the MOSFET power switch, comprising
   an input means to accept a drive pulse having a leading edge and a trailing edge,
   a transformer including a primary winding having first and second primary terminals and a first and second secondary winding connected in series and directionally wound to generate opposite polarity signals at first and second polarity end terminals of the first and second secondary windings respectively,
   a triggerable circuit coupled to the input means and responsive to the leading and trailing edges of the drive pulse respectively to produce a turn-on pulse applied to the first primary terminal and a turn-off pulse applied to the second primary terminal in response thereto respectively,
   a diode coupling the first polarity end terminal of the first secondary winding to the gate electrode of the MOSFET power switch, and applying the turn-on pulse thereto.
   a control MOSFET device having a gate electrode and a main conduction path and having its main conduction path connected to shunt the gate and the first main conduction path electrode of the MOSFET power switch and operative when conducting to drain charge from the gate electrode of the MOSFET power switch, and
   a breakdown diode coupling the second polarity end terminal of the second secondary winding to the gate electrode of the control MOSFET device and applying the turnoff pulse thereto and the breakdown diode being poled to breakdown at termination of the turnoff pulse and maintain a breakdown voltage to prevent draining charge from the gate electrode of the control MOSFET device and keep the control MOSFET device biased conducting until the drive circuit generates a turn-on signal to turn on the MOSFET power switch.

2. A combination as defined in claim 1 wherein the drive circuit further includes a resistor in series with the MOSFET control device.

3. A combination as defined in claim 2 wherein further including first and second polarity inverting buffer circuits and the first and second output of the triggerable circuit being coupled to the opposite terminal leads at the primary winding via the first and second polarity inverting buffer circuits, respectively.

* * * * *